(12) United States Patent
Jung (10) Patent No.: US 9,129,670 B2
(45) Date of Patent: Sep. 8, 2015

(54) SEMICONDUCTOR DEVICES

(71) Applicant: SK hynix Inc., Icheon-si Gyeonggi-do (KR)

(72) Inventor: Ho Don Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/258,395

(22) Filed: Apr. 22, 2014

(65) Prior Publication Data

US 2015/0124536 A1 May 7, 2015

(30) Foreign Application Priority Data

Nov. 6, 2013 (KR) .................. 10-2013-0134316

(51) Int. Cl.
*G11C 8/00* (2006.01)
*G11C 7/22* (2006.01)
*G11C 7/10* (2006.01)

(52) U.S. Cl.
CPC .............. *G11C 7/222* (2013.01); *G11C 7/1057* (2013.01); *G11C 7/1066* (2013.01)

(58) Field of Classification Search
USPC .............................. 365/233.13, 189.07, 233.1
See application file for complete search history.

(56) References Cited

U.S. PATENT DOCUMENTS

2010/0014343 A1* 1/2010 Wei et al. ................. 365/148
2013/0141994 A1 6/2013 Ito et al.

FOREIGN PATENT DOCUMENTS

KR 1020070056446 A 6/2007

* cited by examiner

*Primary Examiner* — Vu Le
(74) *Attorney, Agent, or Firm* — William Park & Associates Ltd.

(57) ABSTRACT

The semiconductor device includes a comparator and a data output unit. The comparator compares a phase of a first pulse signal generated in a first memory region with a phase of a second pulse signal generated in a second memory region and responsively generates a detection signal. The data output unit outputs first data received from the first memory region as output data in synchronization with a first output strobe signal generated by defining a pulse width of a first strobe signal in response to the detection signal and outputs second data received from the second memory region as the output data in synchronization with a second output strobe signal generated by defining a pulse width of a second strobe signal in response to the detection signal.

21 Claims, 5 Drawing Sheets

SEMICONDUCTOR DEVICES

CROSS-REFERENCE TO RELATED APPLICATION

The present application claims priority under 35 U.S.C 119(a) to Korean Application No. 10-2013-0134316, filed on Nov. 6, 2013, in the Korean Intellectual Property Office, which is incorporated herein by reference in its entirety as set forth in full.

TECHNICAL FIELD

Embodiments relate to semiconductor devices.

BACKGROUND

Demand for relatively faster semiconductor systems is on the rise in response to improvements in semiconductor integration density. Synchronous devices operating in synchronization with external clock signals are often used to improve the operation speed of semiconductor devices.

Single data rate (SDR) synchronous semiconductor devices have been used in the past to address the demand for improved the operation speed. The SDR synchronous semiconductor devices may receive as an input or generate as an output data through a single data pin in synchronization with every rising edge of an external clock signal.

However, there is an increase in demand for high performance semiconductor devices operating at relatively higher speeds than the SDR synchronous semiconductor devices to accommodate relatively higher performance semiconductor systems. Double data rate (DDR) synchronous semiconductor devices evolved to address the needs of such high performance semiconductor systems. The DDR synchronous semiconductor devices may receive as an input or generate as an output data in synchronization with every rising edge and with every falling edge of an external clock signal. This enables DDR synchronous semiconductor devices to operate at approximately twice the speed of SDR synchronous semiconductor devices in response to an external clock signal having substantially the same frequency as an external clock signal used by SDR synchronous devices.

SUMMARY

An embodiment of a semiconductor device includes a comparator and a data output unit. The comparator compares a phase of a first pulse signal generated in a first memory region with a phase of a second pulse signal generated in a second memory region and responsively generates a detection signal. The data output unit outputs first data received from the first memory region as output data in synchronization with a first output strobe signal generated by defining a pulse width of a first strobe signal in response to the detection signal and outputs second data received from the second memory region as the output data in synchronization with a second output strobe signal generated by defining a pulse width of a second strobe signal in response to the detection signal.

An embodiment of a semiconductor device includes a first memory region suitable for generating a first pulse signal including a pulse and a first strobe signal including a pulse in a read mode and suitable for outputting first data in the read mode, a second memory region suitable for generating a second pulse signal including a pulse and a second strobe signal including a pulse in the read mode and suitable for outputting second data in the read mode, a comparator suitable for generating an enabled detection signal when a pulse of the second pulse signal coincides with a pulse of the first pulse signal, and a data output unit suitable for outputting the first data as output data in synchronization with a first output strobe signal generated by defining a pulse width of the first strobe signal when the detection signal is enabled and suitable for outputting the second data as the output data in synchronization with a second output strobe signal generated by defining a pulse width of the second strobe signal when the detection signal is enabled.

An embodiment of a system includes a memory controller and a semiconductor memory device. The semiconductor memory device includes a comparator and a data output unit. The comparator compares a phase of a first pulse signal generated in a first memory region with a phase of a second pulse signal generated in a second memory region and responsively generates a detection signal. The data output unit outputs first data received from the first memory region as output data in synchronization with a first output strobe signal generated by defining a pulse width of a first strobe signal in response to the detection signal and outputs second data received from the second memory region as the output data in synchronization with a second output strobe signal generated by defining a pulse width of a second strobe signal in response to the detection signal.

DETAILED DESCRIPTION OF THE EMBODIMENTS

Various embodiments will be described hereinafter with reference to the accompanying drawings. However, the embodiments described herein are for illustrative purposes only and are not intended to limit the scope of the present invention.

Figure 1:
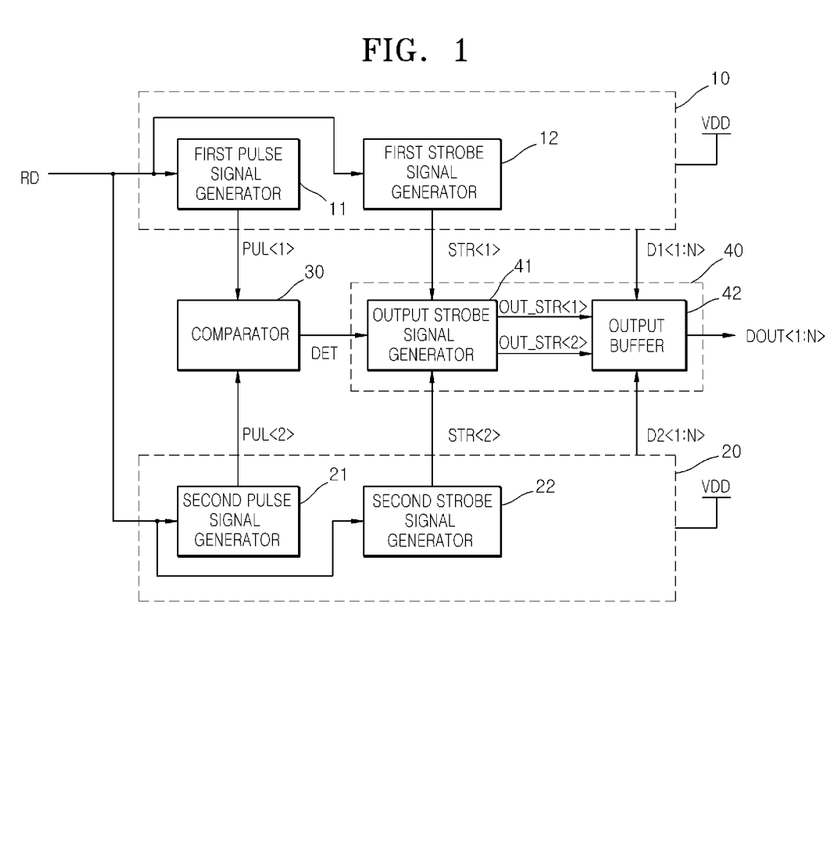
FIG. 1 is a block diagram illustrating an embodiment of a semiconductor device.

Referring to FIG. 1, an embodiment of a semiconductor device may include a first memory region 10, a second memory region 20, a comparator 30 and a data output unit 40.

The first memory region 10 may include a first pulse signal generator 11 and a first strobe signal generator 12. The first pulse signal generator 11 may receive a power supply voltage signal VDD and a read signal RD in a read mode to generate a first pulse signal PUL<1>. The first pulse signal PUL<1> includes a pulse. The first strobe signal generator 12 may receive the power supply voltage signal VDD and the read signal RD to generate a first strobe signal STR<1>. The first strobe signal STR<1> includes a pulse. The first memory region 10 may output a first data D1<1:N> in the read mode. The first data D1<1:N> may be output by the first memory region 10 in accordance with the first strobe signal STR<1>.

The second memory region 20 may include a second pulse signal generator 21 and a second strobe signal generator 22. The second pulse signal generator 21 may receive the power supply voltage signal VDD and the read signal RD in the read mode to generate a second pulse signal PUL<2>. The second pulse PUL<2> includes a pulse. The second strobe signal generator 22 may receive the power supply voltage signal VDD and the read signal RD to generate a second strobe signal STR<2>. The second strobe signal STR<2> includes a pulse. The second memory region 20 may output a second data D2<1:N> in the read mode. The second data D2<1:N> may be output by the second memory region 20 in accordance with the first strobe signal STR<2>. The first and second pulse signals PUL<1>, PUL<2> may have different phases. For example, a phase difference between the first and second pulse signals PUL<1>, PUL<2> may be approximately 180 degrees.

The comparator 30 may receive the first and second pulse signals PUL<1>, PUL<2> as inputs. The comparator 30 may compare the first pulse signal PUL<1> with the second pulse signal PUL<2> and responsively generate a detection signal DET as an output.

The data output unit 40 may include an output strobe signal generator 41 and an output buffer 42. The output strobe signal generator 41 may receive the first strobe signal STR<1> and the detection signal DET as inputs. The output strobe signal generator 41 may define a pulse width of the received first strobe signal STR<1> in response to the detection signal DET and responsively generate a first output strobe signal OUT_STR<1> having the defined pulse width. The output strobe signal generator 41 may define a pulse width of the received second strobe signal STR<2> in response to the detection signal DET and responsively generate a second output strobe signal OUT_STR<2> having the defined pulse width. The output buffer 42 may receive the first data D1<1:N> as an input and generate output data DOUT<1:N> as an output in synchronization with a pulse of the first output strobe signal OUT_STR<1>. The output buffer 42 may receive the second data D2<1:N> as an input and generate output data DOUT<1:N> as an output in synchronization with a pulse of the second output strobe signal OUT_STR<2>.

Figure 2:
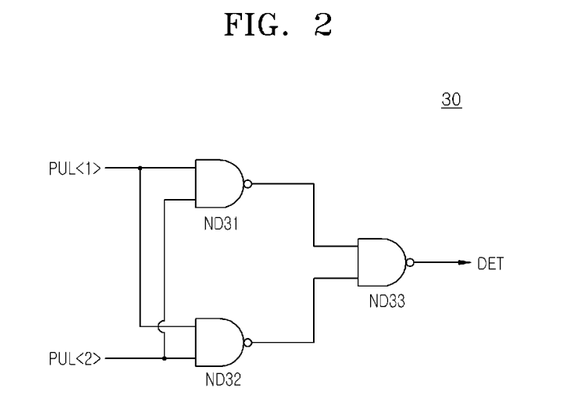
FIG. 2 is a logic circuit illustrating an embodiment of a comparator of the semiconductor device of FIG. 1.

Referring to FIG. 2, the comparator 30 may include first, second and third NAND gates ND31, ND32, ND33. The first NAND gate ND31 may receive the first pulse signal PUL<1> and the second pulse signal PUL<2> as inputs and responsively generate a first NAND gate output signal. The second NAND gate ND32 may receive the first pulse signal PUL<1> and the second pulse signal PUL<2> as inputs and responsively generate a second NAND gate output signal. The third NAND gate ND33 may receive the first NAND gate output signal and the second NAND gate output signal as inputs and responsively generate the detection signal DET. The comparator 30 may generate an enabled detection signal DET having a logic "high" level if a pulse of the second pulse signal PUL<2> occurs while a pulse of the first pulse signal PUL<1> occurs. The detection signal DET may remain at a logic "high" level during the time when a pulse of the first pulse signal PUL<1> generally coincides with a pulse the second pulse signal <2>.

Figure 3:
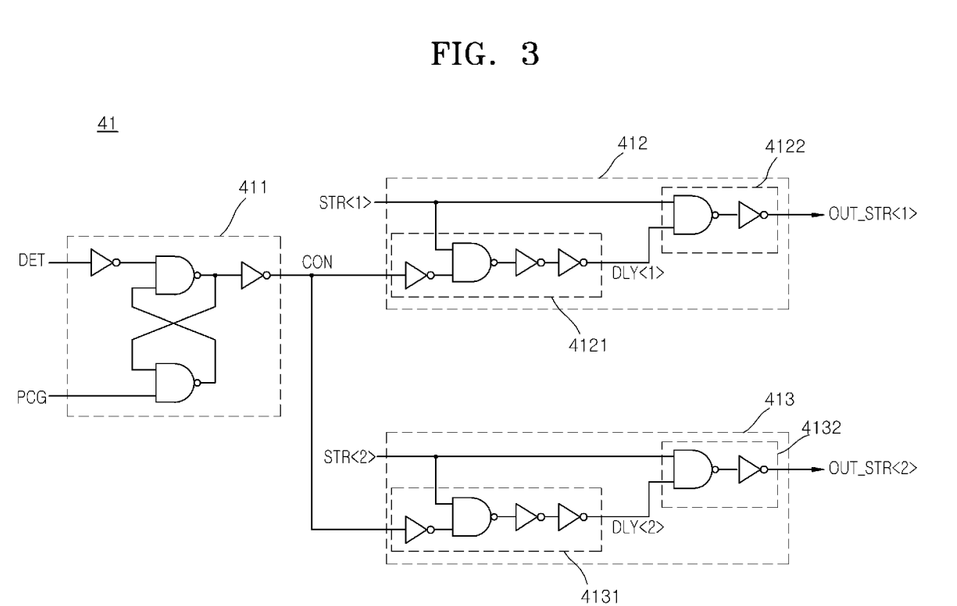
FIG. 3 is a logic circuit illustrating an embodiment of an output strobe signal generator of the semiconductor device of FIG. 1.

Referring to FIG. 3, the output strobe signal generator 41 may include a control signal generator 411, a first output strobe signal generator 412 and a second output strobe signal generator 413.

The control signal generator 411 may generate an enabled control signal CON having a logic "low" level when the control signal generator 411 receives an enabled detection signal DET having a logic "high" level as an input. The control signal generator 411 may generate a disabled control signal CON having a logic "high" level when the control signal generator 411 receives a pre-charge signal PCG have a logic "low" level as an input. The pre-charge signal PCG may have a logic "low" level when in pre-charge mode after the read mode.

The first output strobe signal generator 412 may include a first delay unit 4121 and a first logic unit 4122. The first delay unit 4121 may receive the first strobe signal STR<1> and the control signal CON as inputs. The first delay unit 4121 may delay the received first strobe signal STR<1> by a predetermined delay time to generate a first delay signal DLY<1> when the received control signal CON has a logic "low" level. The first delay unit 4121 may generate the first delay signal DLY<1> having a logic "high" level when the received control signal CON has a logic "high" level. The first logic unit 4122 may receive the first strobe signal STR<1> and the first delay signal DLY<1> as inputs. The first logic unit 4122 may generate the first output strobe signal OUT_STR<1> having a logic "high" level if the received first delay signal DLY<1> has a logic "high" level while a pulse of the first strobe signal STR<1> is being received at the first logic unit 4122. The first output strobe signal generator 412 may reduce a pulse width of the received first strobe signal STR<1> and generate the reduced pulse width version of the first strobe signal STR<1> as the first output strobe signal OUT_STR<1> if the control signal CON is enabled to have a logic "low" level. The first output strobe signal generator 412 may buffer the received first strobe signal STR<1> to generate the first output strobe signal OUT_STR<1> if the received control signal CON is disabled. When the control signal CON is disabled, the control signal CON has a logic "high" level.

The second output strobe signal generator 413 may include a second delay unit 4131 and a second logic unit 4132. The second delay unit 4131 may receive the second strobe signal STR<2> and the control signal CON as inputs. The second delay unit 4131 may delay the received the second strobe signal STR<2> by a predetermined delay time to generate a second delay signal DLY<2> when the received control signal CON has a logic "low" level. The second delay unit 4131 may generate the second delay signal DLY<2> having a logic "high" level when the received control signal CON has a logic "high" level. The second logic unit 4132 may receive the second strobe signal STR<2> and the second delay signal DLY<2> as inputs. The second logic unit 4132 may generate the second output strobe signal OUT_STR<2> having a logic "high" level if the received second delay signal DLY<2> has a logic "high" level while a pulse of the second strobe signal STR<2> is being received at the second logic unit 4132. The second output strobe signal generator 413 may reduce a pulse width of the received second strobe signal STR<2> and generate the reduced pulse width version of the second strobe signal STR<2> as the second output strobe signal OUT_STR<2> if the control signal CON is enabled to have a logic "low" level. The second output strobe signal generator 413 may buffer the received second strobe signal STR<2> to generate the second output strobe signal OUT_STR<2> if the received control signal CON is disabled. When the control signal CON is disabled, the control signal CON has a logic "high" level.

Figure 4:
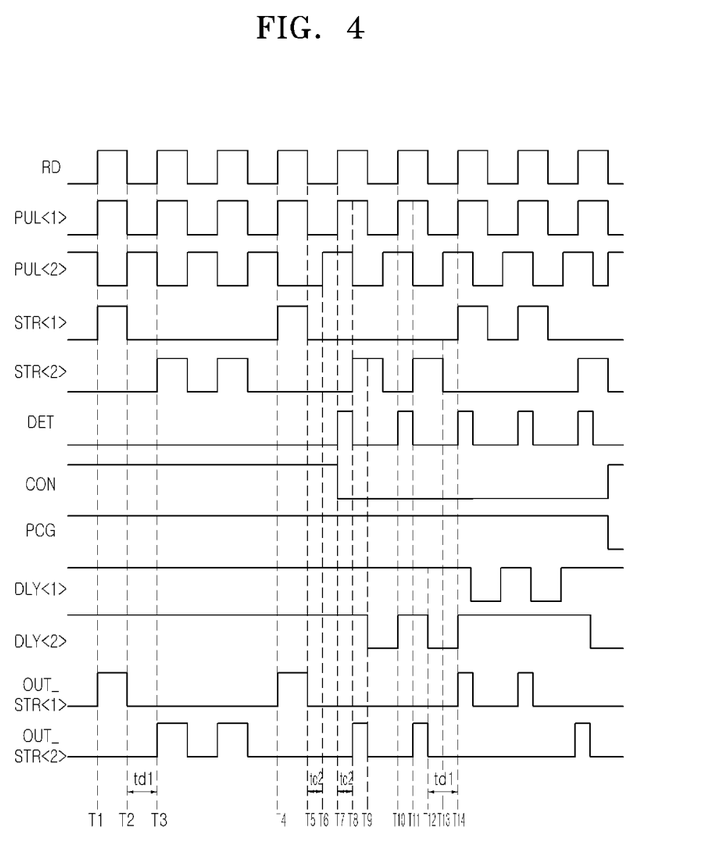
FIG. 4 is a timing diagram illustrating an operation of an embodiment of a semiconductor device.

An operation of an embodiment of the semiconductor device having the aforementioned configuration will be described with reference to FIG. 4. An example of the operation of the semiconductor device where the generation of the pulses of the first and second strobe signals STR<1>, STR<2> are not delayed and an example of the operation of the semiconductor device where the generation of the pulses of the first and second strobe signals STR<1>, STR<2> are delayed will be described.

An example of the operation of the semiconductor device where the generation of pulses of the first and second strobe signals STR<1>, STR<2> will be described first. The first and second strobe signals STR<1>, STR<2> are not delayed when a level of the power supply voltage signal VDD according to read operations of the first and second memory regions 10 and 20 is not changed.

At a time "T1", the semiconductor device may execute a read operation of the first memory region 10 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "high" level.

The second pulse signal generator 21 of the second memory region 20 may generate the second pulse signal PUL<2> having a logic "low" level. The second strobe signal generator 22 of the second memory region 20 may generate the second strobe signal STR<2> having a logic "low" level.

The comparator 30 may generate the detection signal DET having a logic "low" level because the first pulse signal PUL<1> has a logic "high" level and the second pulse signal PUL<2> has a logic "low" level.

The control signal generator 411 of the output strobe signal generator 41 may generate the control signal CON having a logic "high" level because the detection signal DET has a logic "low" level. The first delay unit 4121 of the first output strobe signal generator 412 may receive the control signal CON having a logic "high" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "high" level. The second delay unit 4131 of the second output strobe signal generator 413 may receive the control signal CON having a logic "high" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 may output the first data D1<1:N> as the output data DOUT<1:N> in synchronization with the first output strobe signal OUT_STR<1>.

At a time "T2", the semiconductor device may terminate the read operation of the first memory region 10 in response to the read signal RD having a logic "low" level.

The first pulse signal generator 11 of the first memory region 10 may generate the first pulse signal PUL<1> having a logic "low" level. The first strobe signal generator 12 of the first memory region 10 may generate the first strobe signal STR<1> having a logic "low" level.

The second pulse signal generator 21 of the second memory region 20 may generate the second pulse signal PUL<2> having a logic "high" level. The second strobe signal generator 22 of the second memory region 20 may generate the second strobe signal STR<2> having a logic "low" level.

The comparator 30 may generate the detection signal DET having a logic "low" level because the first pulse signal PUL<1> has a logic "low" level and the second pulse signal PUL<2> has a logic "high" level.

The control signal generator 411 of the output strobe signal generator 41 may generate the control signal CON having a logic "high" level because the detection signal DET has a logic "low" level. The first delay unit 4121 of the first output strobe signal generator 412 may receive the control signal CON having a logic "high" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may receive the control signal CON having a logic "high" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 does not generate the output data DOUT<1:N> because the output buffer 42 does not receive any pulses of the first and second output strobe signal OUT_STR<1>, OUT_STR<2> as inputs.

At a time "T3", the semiconductor device may execute a read operation of the second memory region 20 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "low" level.

The second pulse signal generator 21 of the second memory region 20 may generate the second pulse signal PUL<2> having a logic "low" level. The second strobe signal generator 22 of the second memory region 20 may generate the second strobe signal STR<2> having a logic "high" level.

The comparator 30 may generate the detection signal DET having a logic "low" level because the first pulse signal PUL<1> has a logic "high" level and the second pulse signal PUL<2> has a logic "low" level.

The control signal generator 411 of the output strobe signal generator 41 may generate the control signal CON having a logic "high" level because the detection signal DET has a logic "low" level. The first delay unit 4121 of the first output strobe signal generator 412 may receive the control signal CON having a logic "high" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may receive the control signal CON having a logic "high" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "high" level. In such a case, the output buffer 42 may output the second data D2<1:N> as the output data DOUT<1:N> in synchronization with the second output strobe signal OUT_STR<2>.

The second output strobe signal OUT_STR<2> may have a logic "high" level after a first interval time td1. The first interval time td1 corresponds to half a cycle time of the read signal RD following the time "T2" when the first output strobe signal OUT_STR<1> falls to a logic "low" level. In the event that a level of the power supply voltage signal VDD supplied to the first and second memory regions 10, 20 is not lowered, a timing margin between the first and second output strobe signals OUT_STR<1> and OUT_STR<2> may be set to be the first interval time td1.

Next, an example of the operation of an embodiment of the semiconductor device will be described with reference to FIG. 4. An example of the operation of the semiconductor device where the second strobe signal STR<2> is delayed because a level of the power supply voltage signal VDD supplied to the second memory region 20 is lowered according to a read operation of the second memory region 20.

At a time "T4", the semiconductor device may execute a read operation of the first memory region 10 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "high" level.

The second pulse signal generator 21 of the second memory region 20 may generate the second pulse signal PUL<2> having a logic "low" level. The second strobe signal generator 22 of the second memory region 20 may generate the second strobe signal STR<2> having a logic "low" level.

The comparator 30 may generate the detection signal DET having a logic "low" level because the first pulse signal PUL<1> has a logic "high" level and the second pulse signal PUL<2> has a logic "low" level.

The control signal generator 411 of the output strobe signal generator 41 may generate the control signal CON having a logic "high" level because the detection signal DET has a logic "low" level. The first delay unit 4121 of the first output strobe signal generator 412 may receive the control signal CON having a logic "high" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "high" level. The second delay unit 4131 of the second output strobe signal generator 413 may receive the control signal CON having a logic "high" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 may output the first data D1<1:N> as the output data DOUT<1:N> in synchronization with the first output strobe signal OUT_STR<1>.

At a time "T5", the semiconductor device may terminate the read operation of the first memory region 10 in response to the read signal RD having a logic "low" level.

The first pulse signal generator 11 of the first memory region 10 may generate the first pulse signal PUL<1> having a logic "low" level. The first strobe signal generator 12 of the first memory region 10 may generate the first strobe signal STR<1> having a logic "low" level.

The second pulse signal generator 21 of the second memory region 20 may generate the second pulse signal PUL<2> having a logic "low" level. The second strobe signal generator 22 of the second memory region 20 may generate the second strobe signal STR<2> having a logic "low" level.

The comparator 30 may generate the detection signal DET having a logic "low" level because the first pulse signal PUL<1> has a logic "low" level and the second pulse signal PUL<2> has a logic "low" level.

The control signal generator 411 of the output strobe signal generator 41 may generate the control signal CON having a logic "high" level because the detection signal DET has a logic "low" level. The first delay unit 4121 of the first output strobe signal generator 412 may receive the control signal CON having a logic "high" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may receive the control signal CON having a logic "high" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 does not generate the output data DOUT<1:N> because the output buffer 42 does not receive any pulses of the first and second output strobe signals OUT_STR<1>, OUT_STR<2> as inputs.

At a time "T6", the second pulse signal generator 21 of the second memory region 20 may generate the second pulse signal PUL<2> having a logic "high" level. In the event that a level of the power supply voltage signal VDD supplied to the second memory region 20 is lowered, a pulse of the second pulse signal PUL<2> may be generated after a second interval time td2 elapses following the time "T5".

At a time "T7", the semiconductor device may execute a read operation of the second memory region 20 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "low" level.

The second pulse signal generator 21 of the second memory region 20 may generate the second pulse signal PUL<2> having a logic "high" level. The second strobe signal generator 22 of the second memory region 20 may generate the second strobe signal STR<2> having a logic "low" level.

The comparator 30 may generate the detection signal DET having a logic "high" level because the first pulse signal PUL<1> has a logic "high" level and the second pulse signal PUL<2> has a logic "high" level.

The control signal generator 411 of the output strobe signal generator 41 may generate the control signal CON having a logic "low" level because the detection signal DET has a logic "high" level. The first delay unit 4121 of the first output strobe signal generator 412 may invert and delay the first strobe signal STR<1> in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may invert and delay the second strobe signal STR<2> in response to the control signal CON having a logic "low" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 does not generate the output data DOUT<1:N> because the output buffer 42 does not receive any pulses of the first and second output strobe signal OUT_STR<1>, OUT_STR<2> as inputs.

At a time "T8", the second strobe signal generator 22 of the second memory region 20 may generate the second strobe signal STR<2> having a logic "high" level. In the event that a level of the power supply voltage signal VDD supplied to the second memory region 20 is lowered, a pulse of the second strobe signal STR<2> may be generated after a second interval time td2 elapses following the time "T7".

The comparator 30 may generate the detection signal DET having a logic "low" level because the first pulse signal PUL<1> has a logic "high" level and the second pulse signal PUL<2> has a logic "low" level.

The control signal generator 411 of the output strobe signal generator 41 may generate the control signal CON having a logic "low" level because the pre-charge signal PCG has a logic "high" level. The first delay unit 4121 of the first output strobe signal generator 412 may invert and delay the first strobe signal STR<1> with reference to the time "T7" in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may invert and delay the second strobe signal STR<2> with reference to the time "T7" in response to the control signal CON having a logic "low" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "high" level. In such a case, the output buffer 42 may output the second data D2<1:N> as the output data DOUT<1:N> in synchronization with the second output strobe signal OUT_STR<2>.

At a time "T9", the first delay unit 4121 of the first output strobe signal generator 412 may invert and delay the first strobe signal STR<1> with respect to the time "T8" in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may invert and delay the second strobe signal STR<2> with respect to the time "T8" in response to the control signal CON having a logic "low" level to generate the second delay signal DLY<2> having a logic "low" level. The second logic unit 4132 of the second output strobe signal generator 413 may receive the second delay signal DLY<2> having a logic "low" level to generate the second output strobe signal OUT_STR<2> having a logic "low" level. The second output strobe signal generator 413 may reduce a pulse width of the second strobe signal STR<2>.

At a time "T10", the semiconductor device may execute a read operation of the second memory region 20 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "low" level.

The second pulse signal generator 21 of the second memory region 20 may generate the second pulse signal PUL<2> having a logic "high" level. The second strobe signal generator 22 of the second memory region 20 may generate the second strobe signal STR<2> having a logic "low" level.

The comparator 30 may generate the detection signal DET having a logic "high" level because the first pulse signal PUL<1> has a logic "high" level and the second pulse signal PUL<2> has a logic "high" level.

The control signal generator 411 of the output strobe signal generator 41 may generate the control signal CON having a logic "low" level because the pre-charge signal PCG has a logic "high" level. The first delay unit 4121 of the first output strobe signal generator 412 may invert and delay the first strobe signal STR<1> in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may receive the control signal CON having a logic "low" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 does not generate the output data DOUT<1:N> because the output buffer 42 does not receive any pulses of the first and second output strobe signal OUT_STR<1>, OUT_STR<2> as inputs.

At a time "T11", the second strobe signal generator 22 of the second memory region 20 may generate the second strobe signal STR<2> having a logic "high" level. In the event that a level of the power supply voltage signal VDD supplied to the second memory region 20 is lowered, a pulse of the second strobe signal STR<2> may be generated after the second interval time td2 elapses following the time "T10".

The comparator 30 may generate the detection signal DET having a logic "low" level because the first pulse signal PUL<1> has a logic "high" level and the second pulse signal PUL<2> has a logic "low" level.

The control signal generator 411 of the output strobe signal generator 41 may generate the control signal CON having a logic "low" level because the pre-charge signal PCG has a logic "high" level. The first delay unit 4121 of the first output strobe signal generator 412 may invert and delay the first strobe signal STR<1> with reference to the time "T10" in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may invert and delay the second strobe signal STR<2> with reference to the time "T10" in response to the control signal CON having a logic "low" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "high" level. In such a case, the output buffer 42 may output the second data D2<1:N> as the output data DOUT<1:N> in synchronization with the second output strobe signal OUT_STR<2>.

At a time "T12", the first delay unit 4121 of the first output strobe signal generator 412 may invert and delay the first strobe signal STR<1> with reference to the time "T11" in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "low" level. The second delay unit 4131 of the second output strobe signal generator 413 may invert and delay the second strobe signal STR<2> with respect to the time "T11" in response to the control signal CON having a logic "low" level to generate the second delay signal DLY<2> having a logic "low" level. The second logic unit 4132 of the second output strobe signal generator 413 may receive the second delay signal DLY<2> having a logic "low" level to generate the second output strobe signal OUT_STR<2> having a logic "low" level. The second output strobe signal generator 413 may reduce a pulse width of the second output strobe signal OUT_STR<2>.

At a time "T14", the semiconductor device may execute a read operation of the first memory region 10 in response to the read signal RD having a logic "high" level.

The first pulse signal generator 11 of the first memory region 10 may generate the first pulse signal PUL<1> having a logic "high" level. The first strobe signal generator 12 of the first memory region 10 may generate the first strobe signal STR<1> having a logic "high" level.

The second pulse signal generator 21 of the second memory region 20 may generate the second pulse signal PUL<2> having a logic "high" level. The second strobe signal generator 22 of the second memory region 20 may generate the second strobe signal STR<2> having a logic "low" level.

The comparator 30 may generate the detection signal DET having a logic "high" level because the first pulse signal PUL<1> has a logic "high" level and the second pulse signal PUL<2> has a logic "high" level.

The control signal generator 411 of the output strobe signal generator 41 may generate the control signal CON having a logic "low" level because the pre-charge signal PCG has a logic "high" level. The first delay unit 4121 of the first output strobe signal generator 412 may invert and delay the first strobe signal STR<1> with respect to the time "T13" in response to the control signal CON having a logic "low" level to generate the first delay signal DLY<1> having a logic "high" level. The first logic unit 4122 of the first output strobe signal generator 412 may buffer the first strobe signal STR<1> in response to the first delay signal DLY<1> having a logic "high" level to generate the first output strobe signal OUT_STR<1> having a logic "high" level. The second delay unit 4131 of the second output strobe signal generator 413 may invert and delay the second strobe signal STR<2> with respect to the time "T13" in response to the control signal CON having a logic "low" level to generate the second delay signal DLY<2> having a logic "high" level. The second logic unit 4132 of the second output strobe signal generator 413 may buffer the second strobe signal STR<2> in response to the second delay signal DLY<2> having a logic "high" level to generate the second output strobe signal OUT_STR<2> having a logic "low" level. In such a case, the output buffer 42 may output the first data D1<1:N> as the output data DOUT<1:N> in synchronization with the first output strobe signal OUT_STR<1>.

The first output strobe signal OUT_STR<1> may be generated to have a logic "high" level after the first interval time td1 corresponding to a half cycle time of the read signal RD has elapsed following the time "T12" when the second output strobe signal OUT_STR<2> falls down to a logic "low" level. In the event that a level of the power supply voltage signal VDD supplied to the second memory region 20 is lowered, a pulse width of the second output strobe signal OUT_STR<2> may be reduced to set a timing margin between the first and second output strobe signals OUT_STR<1> and OUT_STR<2> to the first interval time td1.

As described above, a semiconductor device according to the embodiments may control pulse widths of strobe signals generated to synchronize data outputted from different memory regions according to a level of a power supply voltage signal to obtain a timing margin between the strobe signals.

Figure 5:
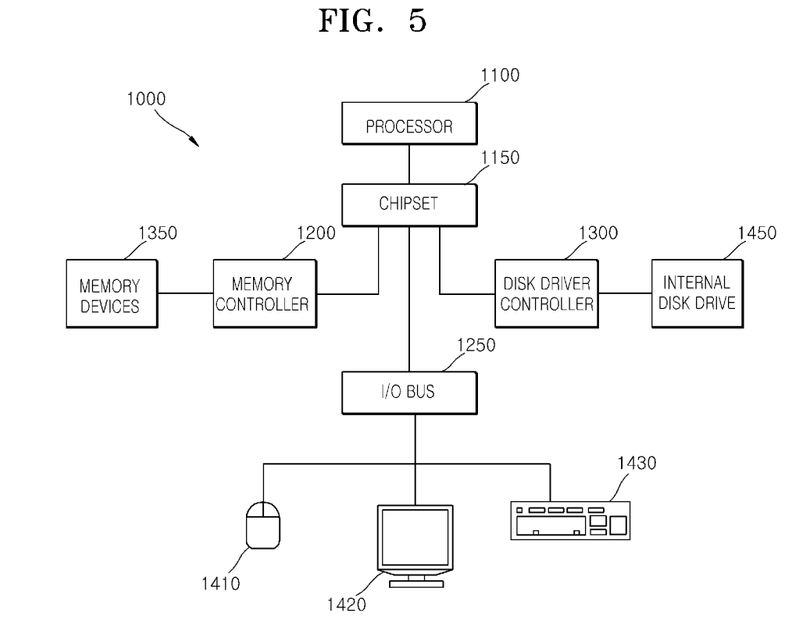
FIG. 5 is a block diagram representation of a system including an embodiment of a semiconductor memory device.

Referring to FIG. 5, a block diagram representation of a system 1000 including an embodiment of a semiconductor device 1350 is shown. In an embodiment, the semiconductor device 1350 is the semiconductor device of FIG. 1. In an embodiment, the semiconductor device 1350 is a semiconductor memory device. The system 1000 includes one or more semiconductor memory devices 1350 and a memory controller 1200.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 5 is merely one example of a system employing a semiconductor memory device 1350. In alternate embodiments, such as cellular phones or digital cameras, the components may differ from the embodiment shown in FIG. 5.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
    a comparator suitable for comparing a phase of a first pulse signal generated in a first memory region with a phase of a second pulse signal generated in a second memory region and responsively generating a detection signal; and
    a data output unit suitable for outputting first data received from the first memory region as output data in synchronization with a first output strobe signal generated by defining a pulse width of a first strobe signal in response to the detection signal and suitable for outputting second data received from the second memory region as the output data in synchronization with a second output strobe signal generated by defining a pulse width of a second strobe signal in response to the detection signal.

2. The semiconductor device of claim 1, wherein a phase difference between the first and second pulse signals is approximately 180 degrees.

3. The semiconductor device of claim 1, wherein the detection signal is enabled when a pulse of the second pulse signal coincides with a pulse of the first pulse signal.

4. The semiconductor device of claim 1, wherein the first strobe signal includes a pulse having a pulse width associated with the execution of a read operation of the first memory region.

5. The semiconductor device of claim 1, wherein the second strobe signal includes a pulse having a pulse width associated with the execution of a read operation of the second memory region.

6. The semiconductor device of claim 1, wherein the first output strobe signal is generated by reducing a pulse width of the first strobe signal when the detection signal is enabled.

7. The semiconductor device of claim 1, wherein the second output strobe signal is generated by reducing a pulse width of the second strobe signal when the detection signal is enabled.

8. The semiconductor device of claim 1, wherein the data output unit includes:
    an output strobe signal generator suitable for defining a pulse width of the first strobe signal in response to the detection signal to generate the first output strobe signal and suitable for defining a pulse width of the second strobe signal in response to the detection signal to generate the second output strobe signal; and
    an output buffer suitable for outputting the first data as the output data in synchronization with a pulse of the first output strobe signal and suitable for outputting the second data as the output data in synchronization with a pulse of the second output strobe signal.

9. The semiconductor device of claim 8, wherein the output strobe signal generator includes:
    a control signal generator suitable for generating a control signal, wherein the control signal is enabled when the detection signal is enabled and is disabled in response to a pre-charge signal in a pre-charge mode after a read mode;
    a first output strobe signal generator suitable for defining a pulse width of the first strobe signal to generate the first output strobe signal when the control signal is enabled and suitable for buffering the first strobe signal to generate the first output strobe signal when the control signal is disabled; and
    a second output strobe signal generator suitable for defining a pulse width of the second strobe signal to generate the second output strobe signal when the control signal is enabled and suitable for buffering the second strobe signal to generate the second output strobe signal when the control signal is disabled.

10. The semiconductor device of claim 9, wherein the first output strobe signal generator includes:
    a first delay unit suitable for inverting and delaying the first strobe signal to generate a first delay signal when the control signal is enabled and suitable for generating the first delay signal as a disabled first delay signal when the control signal is disabled; and
    a first logic unit suitable for defining a pulse width of the first strobe signal in response to the first delay signal to generate the first output strobe signal and suitable for buffering the first strobe signal to generate the first output strobe signal when the first delay signal is disabled.

11. The semiconductor device of claim 9, wherein the second output strobe signal generator includes:
    a second delay unit suitable for inverting and delaying the second strobe signal to generate a second delay signal when the control signal is enabled and suitable for generating the second delay signal as a disabled second delay signal when the control signal is disabled; and
    a second logic unit suitable for defining a pulse width of the second strobe signal in response to the second delay signal to generate the second output strobe signal and suitable for buffering the second strobe signal to generate the second output strobe signal when the second delay signal is disabled.

12. A semiconductor device comprising:
a first memory region suitable for generating a first pulse signal including a pulse and a first strobe signal including a pulse in a read mode and suitable for outputting first data in the read mode;
a second memory region suitable for generating a second pulse signal including a pulse and a second strobe signal including a pulse in the read mode and suitable for outputting second data in the read mode;
a comparator suitable for generating an enabled detection signal when a pulse of the second pulse signal coincides with a pulse of the first pulse signal; and
a data output unit suitable for outputting the first data as output data in synchronization with a first output strobe signal generated by defining a pulse width of the first strobe signal when the detection signal is enabled and suitable for outputting the second data as the output data in synchronization with a second output strobe signal generated by defining a pulse width of the second strobe signal when the detection signal is enabled.

13. The semiconductor device of claim 12, wherein a phase difference between the first and second pulse signals is approximately 180 degrees.

14. The semiconductor device of claim 12, wherein the first output strobe signal is generated by reducing a pulse width of the first strobe signal when the detection signal is enabled.

15. The semiconductor device of claim 12, wherein the second output strobe signal is generated by reducing a pulse width of the second strobe signal when the detection signal is enabled.

16. The semiconductor device of claim 12, wherein the first memory region includes:
a first pulse signal generator suitable for generating the first pulse signal including a pulse created in response to a read signal; and
a first strobe signal generator suitable for generating the first strobe signal including a pulse created when the first data is output in response to the read signal.

17. The semiconductor device of claim 12, wherein the second memory region includes:
a second pulse signal generator suitable for generating the second pulse signal including a pulse created in response to a read signal; and
a second strobe signal generator suitable for generating the second strobe signal including a pulse created when the second data is output in response to the read signal.

18. The semiconductor device of claim 12, wherein the data output unit includes:
an output strobe signal generator suitable for defining a pulse width of the first strobe signal in response to the detection signal to generate the first output strobe signal and suitable for defining a pulse width of the second strobe signal in response to the detection signal to generate the second output strobe signal; and
an output buffer suitable for outputting the first data as the output data in synchronization with a pulse of the first output strobe signal and suitable for outputting the second data as the output data in synchronization with a pulse of the second output strobe signal.

19. The semiconductor device of claim 18, wherein the output strobe signal generator includes:
a control signal generator suitable for generating a control signal, wherein the control signal is enabled when the detection signal is enabled and disabled in response to a pre-charge signal in a pre-charge mode after the read mode;
a first output strobe signal generator suitable for defining a pulse width of the first strobe signal to generate the first output strobe signal when the control signal is enabled and suitable for buffering the first strobe signal to generate the first output strobe signal when the control signal is disabled; and
a second output strobe signal generator suitable for defining a pulse width of the second strobe signal to generate the second output strobe signal when the control signal is enabled and suitable for buffering the second strobe signal to generate the second output strobe signal when the control signal is disabled.

20. The semiconductor device of claim 19, wherein the first output strobe signal generator includes:
a first delay unit suitable for inverting and delaying the first strobe signal to generate a first delay signal when the control signal is enabled and suitable for generating the first delay signal as a disabled delay signal when the control signal is disabled; and
a first logic unit suitable for defining a pulse width of the first strobe signal in response to the first delay signal to generate the first output strobe signal and suitable for buffering the first strobe signal to generate the first output strobe signal when the first delay signal is disabled.

21. The semiconductor device of claim 19, wherein the second output strobe signal generator includes:
a second delay unit suitable for inverting and delaying the second strobe signal to generate a second delay signal when the control signal is enabled and suitable for generating the second delay signal as a disabled delay signal when the control signal is disabled; and
a second logic unit suitable for defining a pulse width of the second strobe signal in response to the second delay signal to generate the second output strobe signal and suitable for buffering the second strobe signal to generate the second output strobe signal when the second delay signal is disabled.

* * * * *